(12) United States Patent
Hughes

(10) Patent No.: US 8,433,961 B2
(45) Date of Patent: Apr. 30, 2013

(54) DATA PROCESSING APPARATUS AND METHOD FOR TESTING A CIRCUIT BLOCK USING SCAN CHAINS

(75) Inventor: Paul Stanley Hughes, Sunnyvale, CA (US)

(73) Assignee: ARM Limited, Cambridge (GB)

( * ) Notice: Subject to any disclaimer, the term of this patent is extended or adjusted under 35 U.S.C. 154(b) by 381 days.

(21) Appl. No.: 12/662,856

(22) Filed: May 6, 2010

(65) Prior Publication Data

US 2011/0276848 A1    Nov. 10, 2011

(51) Int. Cl.
*G01R 31/28* (2006.01)
(52) U.S. Cl.
USPC .......................................................... 714/729
(58) Field of Classification Search ............ 714/715, 714/724, 726–729, 732–734, 738, 742
See application file for complete search history.

(56) References Cited

U.S. PATENT DOCUMENTS

| | | | |
|---|---|---|---|
| 5,831,992 A * | 11/1998 | Wu ................................ | 714/732 |
| 6,327,687 B1 * | 12/2001 | Rajski et al. ................... | 714/738 |
| 6,543,020 B2 * | 4/2003 | Rajski et al. ................... | 714/738 |
| 7,278,075 B2 * | 10/2007 | Onodera ........................ | 714/726 |
| 7,590,903 B2 * | 9/2009 | Volkerink et al. ............. | 714/725 |
| 2003/0131298 A1 * | 7/2003 | Rajski et al. ................... | 714/738 |
| 2009/0132879 A1 * | 5/2009 | Gangappa ...................... | 714/729 |
| 2010/0017760 A1 * | 1/2010 | Kapur et al. ....................... | 716/2 |
| 2011/0258498 A1 * | 10/2011 | Chandra et al. ............... | 714/726 |

OTHER PUBLICATIONS

DFTMAX Compression, High Quality, Low Cost Test, *Synopsys*, 4 pages (No Date).
Tessent TestKompress, ATPG with Embedded Compression, *Silicon Test and Yield Analysis—Mentor Graphics*, 2 pages (No Date).

* cited by examiner

*Primary Examiner* — Nadeem Iqbal
(74) *Attorney, Agent, or Firm* — Nixon & Vanderhye P.C.

(57) ABSTRACT

A data processing apparatus comprises a circuit block to be tested, and a plurality of scan chains, each scan chain providing a mechanism for providing input test data to, and receiving output test data from, at least a portion of the circuit block during a test mode of operation. Configurable decompression circuitry is provided for supporting a plurality of decompression schemes associated with more than one test generation tool, and configuration circuitry is responsive to a configuration stimulus to configure the configurable decompression circuitry to implement a selected decompression scheme. Thereafter, on receipt of compressed input test data, the configurable decompression circuitry applies the selected decompression scheme to the compressed input test data to produce the input test data to be provided to the plurality of scan chains. Configurable compression circuitry can also be provided in a similar manner, with the configuration stimulus being used to configure the configurable compression circuitry to implement a selected compression scheme to be applied to the output test data in order to produce compressed output test data to be issued from an output interface. Such a mechanism provides a particularly flexible approach for supporting compression and decompression schemes in association with the data input to, and output from, the plurality of scan chains.

21 Claims, 9 Drawing Sheets

DATA PROCESSING APPARATUS AND METHOD FOR TESTING A CIRCUIT BLOCK USING SCAN CHAINS

BACKGROUND OF THE INVENTION

1. Field of the Invention

The present invention relates to a data processing apparatus and method for testing a circuit block using scan chains.

2. Description of the Prior Art

Scan chains are a well-known method for testing a circuit structurally. They allow data to be scanned in and out of a circuit during a test mode of operation in an attempt to detect manufacturing defects.

Scan chains are typically inserted into a circuit design during an Electronic Design Automation (EDA) process. For example, a Hardware Description Language (HDL) description of a circuit (one example of an HDL being Verilog) may be input to an EDA tool developed by a particular EDA vendor, with the EDA tool generating from the HDL description a circuit design (often also referred to as a macrocell). During this process, the EDA tool will typically insert a number of scan chains to allow test data to be input to particular portions of the circuit during a test mode of operation, and following application of that test data to the circuit portion; to then enable output test data to be captured and output from the circuit.

In modern data processing systems, the number of scan chains required to thoroughly test a circuit is becoming very large, but the scan-in and scan-out interfaces provided within the circuit are typically constrained in their size and accordingly will only provide a certain number of pins for scanning in and scanning out the required test data.

In recent years, different EDA vendors have provided support in their tools to allow compressed input test data to be input through the scan-in interface, and similarly for compressed output test data to be output from the scan-out interface. Such support usually involves the inclusion of some hardware in the circuit for decompression of compressed input test data prior to routing of the decompressed test data to the scan chains, and similarly some hardware for receiving the outputs from the scan chains and compressing those outputs in order to generate compressed output test data to route from the scan-out interface.

FIG. 1 schematically illustrates such an approach. In FIG. 1, the scan-in (SI) pins 10 and the scan-out (SO) pins 50 are connected to logic 20, 40 inserted by the EDA tool. These in turn connect to a plurality of internal scan chains 30. The EDA tool typically implements many more internal scan chains than there are scan-in and scan-out pins. Compressed data is hence scanned in on m SI pins, decompressed by logic 20, and then routed through n internal scan chains, where n is greater than m.

An analogous process occurs in reverse with the n outputs of the internal scan chains being routed via the compression logic 40 to the m scan-out pins.

A number of EDA tools use this principle. However, the logic used to decompress and compress the data is EDA tool dependent.

It is common to integrate a circuit produced by a particular EDA tool (and hence for example including the scan chains 30 and associated decompression and compression blocks 20, 40) into a larger design, for example a chip including a plurality of different circuit blocks. For example, such internal scan chains and associated decompression and compression blocks 20, 40 may be provided in association with a single processor core, which may be integrated into a high performance multi-processor chip. However, a problem that can arise when such designs are integrated into larger systems is that if one component implements a scan compression scheme from a single EDA vendor, it becomes necessary to use the same EDA vendor's scan compression scheme for the entire chip. This is undesirable when the chip implementer wishes to use a different EDA tool and associated compression scheme in the design of the chip.

To date, EDA vendors have tended to treat their compression and decompression schemes as proprietary, since a scheme that gives a particularly good compression rate can allow a particular EDA vendor to gain a market edge for its EDA tools when compared with the tools of another EDA vendor.

One approach which has been developed with the aim of allowing more interoperability between different EDA tools is set out in the IEEE Standard IEEE 1450.6.1 (via the Accellera organisation, where it is known as the Open Compression Interface (OCI). The Open Compression Interface specifies a language for describing the logic inserted into a design for the purposes of scan compression, for example the decompression block 20 and the compression block 40 of FIG. 1. In theory, this would allow a description of the decompression logic and compression logic inserted into a circuit design by vendor A's EDA tool to be an input to vendor B's EDA tool to enable vendor B's EDA tool to generate test patterns for inserting into that circuit. However, in practice this does still not give a truly vendor neutral solution as EDA tools are generally not capable of utilising another vendor's compression scheme. Further, even if a standardised definition of the decompression and compression logic inserted by a particular vendor into a circuit design can be realised using the Open Compression Interface, there is still the problem that if that design is inserted into a larger chip, it is preferable for the entire chip to use the same EDA vendor's scan compression scheme.

SUMMARY OF THE INVENTION

Viewed from a first aspect, the present invention provides a data processing apparatus comprising: a circuit block to be tested; a plurality of scan chains, each scan chain in said plurality providing a mechanism for providing input test data to, and receiving output test data from, at least a portion of the circuit block during a test mode of operation; an input interface for receiving compressed input test data; configurable decompression circuitry for supporting a plurality of decompression schemes associated with more than one test generation tool, the configurable decompression circuitry being connected between the input interface and the plurality of scan chains; and configuration circuitry, responsive to a configuration stimulus, to configure the configurable decompression circuitry to implement a selected decompression scheme from said plurality, such that on receipt of the compressed input test data from the input interface the configurable decompression circuitry applies the selected decompression scheme to the compressed input test data to produce the input test data to be provided to said plurality of scan chains.

In accordance with the present invention, configurable decompression circuitry is provided within the data processing apparatus for supporting a plurality of decompression schemes associated with more than one test generation tool. Further, configuration circuitry is responsive to a configuration stimulus to configure the configurable decompression circuitry to implement a selected decompression scheme from amongst that plurality of decompression schemes. Hence, by such a technique, the decompression scheme used to produce input test data to be provided to the plurality of scan chains from the compressed input test data can be altered as and when required in response to an applied configuration stimulus. By such an approach the decompression circuitry can be configured to accept compressed input test data generated by any one of multiple test generation tools.

Such an approach provides significant flexibility over the known prior art techniques. In particular, it allows the decompression scheme to be altered after a particular data processing apparatus has been produced by an EDA tool. This is particularly useful when the data processing apparatus is to be incorporated into a larger design, such as a System-on-Chip (SoC). In particular, it allows the system integrator designing the chip to select the decompression scheme to be used rather than requiring the system integrator to use the particular decompression scheme employed when the data processing apparatus was produced by the EDA tool.

In one embodiment, the data processing apparatus further comprises: an output interface for outputting compressed output test data; and configurable compression circuitry for supporting a plurality of compression schemes associated with more than one test generation tool, the configurable compression circuitry being connected between the plurality of scan chains and the output interface; the configuration circuitry further being responsive to said configuration stimulus, to configure the configurable compression circuitry to implement a selected compression scheme from said plurality, such that on receipt of the output test data from said plurality of scan chains the configurable compression circuitry applies the selected compression scheme to the output test data to produce said compressed output test data to be provided to said output interface.

Hence, in such embodiments, the configuration stimulus can be used to alter both the decompression scheme applied by the decompression circuitry and the compression scheme applied by the compression circuitry, allowing a great degree of flexibility in how test data is generated for input to the scan chains and output from the scan chains.

There are a number of ways in which the configurable decompression circuitry can be provided. In one embodiment, said configurable decompression circuitry comprises a plurality of decompression blocks, each decompression block for implementing one of the decompression schemes from said plurality of decompression schemes; said configuration circuitry being responsive to the configuration stimulus to select one of the decompression blocks, such that the decompression scheme associated with the selected decompression block is used to produce, from the compressed input test data, said input test data to be provided to said plurality of scan chains. Hence, in such embodiments, the decompression circuitry has separate decompression blocks for each of the decompression schemes to be supported, and the configuration stimulus merely causes a selection of the appropriate decompression block. In this way, different decompression blocks can be associated with different EDA test generation tools. This provides a particularly simple and effective mechanism for implementing the configurable decompression circuitry.

A similar approach can be taken with the configurable compression circuitry, and accordingly in one embodiment said configurable compression circuitry comprises a plurality of compression blocks, each compression block for implementing one of the compression schemes from said plurality of compression schemes; said configuration circuitry being responsive to the configuration stimulus to select one of the compression blocks, such that the compression scheme implemented by the selected compression block is used to produce the compressed output test data from the output test data received by said plurality of scan chains. Again, different compression blocks can be associated with different EDA test generation tools.

However, in an alternative embodiment the configurable decompression and compression circuits do not provide a plurality of separate decompression and compression blocks. Instead, in one embodiment, said configurable decompression circuitry is programmable decompression circuitry, and said configuration stimulus provides programming data used by the configuration circuitry to configure the configurable decompression circuitry to implement the selected decompression scheme.

Similarly, the configurable compression circuitry may be provided as programmable compression circuitry, and said configuration stimulus provides programming data used by the configuration circuitry to configure the configurable compression circuitry to implement the selected compression scheme.

The programmable decompression circuitry, and indeed the programmable compression circuitry, can be implemented in a variety of ways. For example, such programmable circuitry may be provided as a field programmable gate array (FPGA), or may be provided by a series of configurable data path elements, such that the programmable decompression or compression circuitry can be programmed to perform any desired logic function.

There are a number of ways in which the configuration stimulus may be applied to the data processing apparatus. In one embodiment, the data processing apparatus further comprises a configuration interface for receiving the configuration stimulus. In embodiments where the decompression and compression circuits provide a number of discrete blocks for each of the desired decompression and compression schemes, then the configuration stimulus may take the form of a select signal used to identify the particular decompression block (and compression block) to be selected. In embodiments where the decompression and compression circuitry is programmable, the configuration interface may be used to input as the configuration stimulus the software or configuration data required to program the decompression circuitry (and compression circuitry).

In an alternative embodiment, the configuration stimulus is provided over the input interface that receives the compressed input test data. For example, in embodiments where discrete decompression and compression blocks are provided for the various decompression and compression schemes, a header field may be provided in association with the compressed input test data to identify the particular decompression block (and compression block) to be selected.

In embodiments where the decompression circuitry and compression circuitry are programmable, then the input pins of the input interface may be used in a particular programming mode of operation to input the required software or configuration data required to program the decompression circuitry (and compression circuitry).

In one embodiment, said plurality of scan chains comprises n scan chains, and said input interface comprises m input pins for receiving said compressed input test data, where n is greater than m. Similarly, in one embodiment, said output interface comprises p output pins for outputting said compressed output test data, where n is greater than p. It is possible for m to be different than p, for example where the compression scheme to be applied to the output test data is not associated with the decompression scheme used for the compressed input test data. However, in one embodiment m does equal p, so that the input interface and output interface have the same number of pins.

The circuit block to be tested can take a variety of forms. In one embodiment, the circuit block comprises processing circuitry for performing data processing operations, whilst in an alternative embodiment the circuit block comprises a memory circuit for storing data values.

Viewed from a second aspect, the present invention provides an integrated circuit comprising: a plurality of circuit blocks, at least one of said circuit blocks being a data processing circuit in accordance with the first aspect of the present invention; and an interface for receiving said configuration stimulus; whereby the decompression scheme employed in respect of said at least one of said circuit blocks is selectable having regard to the integrated circuit in which the at least one of said circuit blocks is incorporated. Accordingly, in such embodiments, even after the circuit block has been designed and is to be incorporated into an integrated circuit, a decision can be taken as to the desired decompression scheme, and the relevant configuration stimulus can then be provided via an interface to the integrated circuit in order to set the desired decompression scheme.

The integrated circuit can take a variety of forms, but in one embodiment is a System-on-Chip (SoC).

Viewed from a third aspect, the present invention provides a data processing apparatus comprising: a circuit block to be tested; a plurality of scan chains, each scan chain in said plurality providing a mechanism for providing input test data to, and receiving output test data from, at least a portion of the circuit block during a test mode of operation; an output interface for outputting compressed output test data; configurable compression circuitry for supporting a plurality of compression schemes associated with more than one test generation tool, the configurable compression circuitry being connected between the plurality of scan chains and the output interface; and configuration circuitry, responsive to a configuration stimulus, to configure the configurable compression circuitry to implement a selected compression scheme from said plurality, such that on receipt of the output test data from said plurality of scan chains the configurable compression circuitry applies the selected compression scheme to the output test data to produce said compressed output test data to be provided to said output interface.

Viewed from a fourth aspect, the present invention provides a method of testing a circuit block within a data processing apparatus, comprising the steps of: (a) providing a plurality of scan chains, each scan chain in said plurality providing a mechanism for providing input test data to, and receiving output test data from, at least a portion of the circuit block; (b) receiving compressed input test data; (c) responsive to a configuration stimulus, configuring configurable decompression circuitry to implement a selected decompression scheme from a plurality of decompression schemes associated with more than one test generation tool and supported by the configurable decompression circuitry; (d) on receipt by the configurable decompression circuitry of the compressed input test data received at said step (b), applying the selected decompression scheme to the compressed input test data to produce the input test data; and (e) providing to said plurality of scan chains the input test data produced at said step (d).

In one embodiment, the method further comprises the steps of: (f) responsive to said configuration stimulus, configuring configurable compression circuitry to implement a selected compression scheme from a plurality of compression schemes associated with more than one test generation tool and supported by said configurable compression circuitry; (g) on receipt by the configurable compression circuitry of the output test data from said plurality of scan chains, applying the selected compression scheme to the output test data to produce compressed output test data; and (h) providing to an output interface the compressed output test data produced at said step (g).

In one embodiment, at said step (b), the compressed input test data received is generated by a test generation tool; and at said step (c), the configuration stimulus is chosen so as to configure the configurable decompression circuitry to implement said selected decompression scheme having regard to at least one test generation algorithm employed by the test generation tool. Hence, the configuration of the configurable decompression (and compression) circuits is made having regard to the test generation algorithms used by the test generation tool producing the compressed input test data.

Viewed from a fifth aspect, the present invention provides a data processing apparatus comprising: circuit means for being tested; a plurality of scan chain means, each scan chain means in said plurality for providing a mechanism for providing input test data to, and receiving output test data from, at least a portion of the circuit means during a test mode of operation; input interface means for receiving compressed input test data; configurable decompression means for supporting a plurality of decompression schemes associated with more than one test generation tool, the configurable decompression means being connected between the input interface means and the plurality of scan chain means; and configuration means, responsive to a configuration stimulus, for configuring the configurable decompression means to implement a selected decompression scheme from said plurality, such that on receipt of the compressed input test data from the input interface means the configurable decompression means applies the selected decompression scheme to the compressed input test data to produce the input test data to be provided to said plurality of scan chain means.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 2:
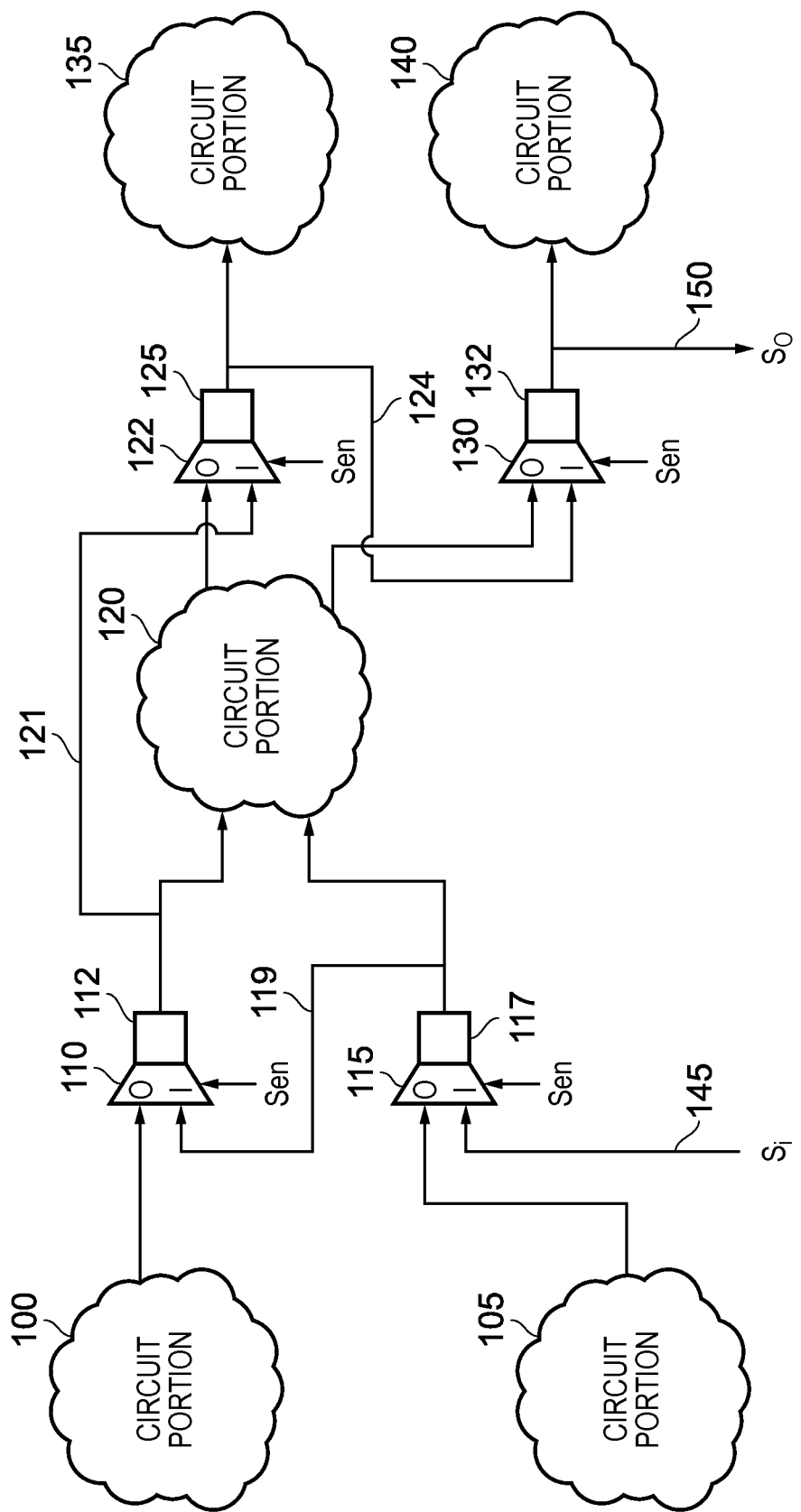
FIG. 2 schematically illustrates the provision of a scan chain within a data processing apparatus.

Before discussing in detail various embodiments of the present invention, a schematic illustration of how scan chains are used within a data processing apparatus will be discussed with reference to FIG. 2. In FIG. 2, processing circuitry has a plurality of interconnected circuit portions 100, 105, 120, 135, 140, with the one or more outputs of each circuit portion being latched prior to provision to a subsequent circuit portion. Hence, the output from circuit portion 100 is stored in the latch 112 via the multiplexer 110, whilst similarly the output from circuit portion 105 is stored in the latch 117 via the multiplexer 115. In the next clock cycle, the currently stored contents of the latch 112, 117 are then provided to the circuit portion 120, which generates outputs stored in the latches 125, 132 via associated multiplexers 122, 130. These outputs are then subsequently provided to the circuit portions 135, 140, respectively.

Figure 3:
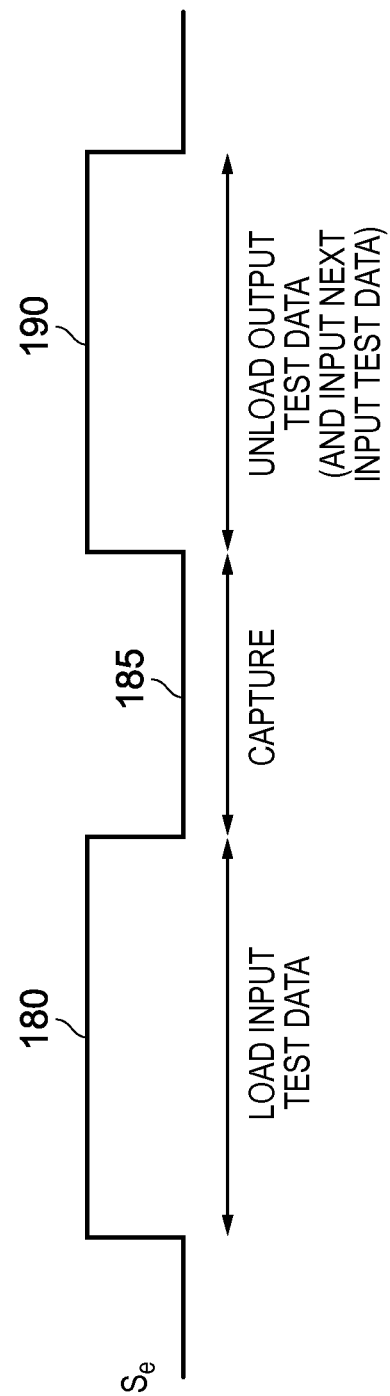
FIG. 3 illustrates the operation of the scan enable signal used in FIG. 2.

Whilst the above describes the operation of the circuit during a normal mode of operation, the circuitry may alternatively be placed in a test mode of operation where the inputs are received via scan chains rather than preceding circuit portions. FIG. 2 illustrates the use of a scan chain to test the operation of the circuit portion 120 during a test mode of operation. In particular, the various latches 117, 112, 125, 132 are linked in series via the paths 119, 121 and 124. Then, during a test mode of operation, a scan enable signal fed to each of the multiplexers 110, 115, 122, 130 can be set, and whilst the scan enable signal is set input test data can be fed serially through the scan-in path 145 to cycle data through the latches 117, 112, 125 and 132. As illustrated in FIG. 3, this process takes place during a high phase 180 of the scan enable signal, and serves to load input test data into the relevant latches.

Once the load process is complete, the scan enable signal goes low, and the circuit portion 120 is then caused to operate for a clock cycle using the test data that has been placed in the latches. The other circuit portions will also operate during this process, and accordingly each of the latches 112, 117, 125, 132 will then latch output test data generated by the various circuit portions. This process is known as the capture process, and as shown in FIG. 3 takes place during a low period of the scan enable signal illustrated by the line 185 in FIG. 3.

Following the capture phase, then the scan enable signal again goes high as illustrated by the line 190 in FIG. 3, during which an unload process is then performed to read out the output test data via the scan out path 150 shown in FIG. 2.

Figure 1:
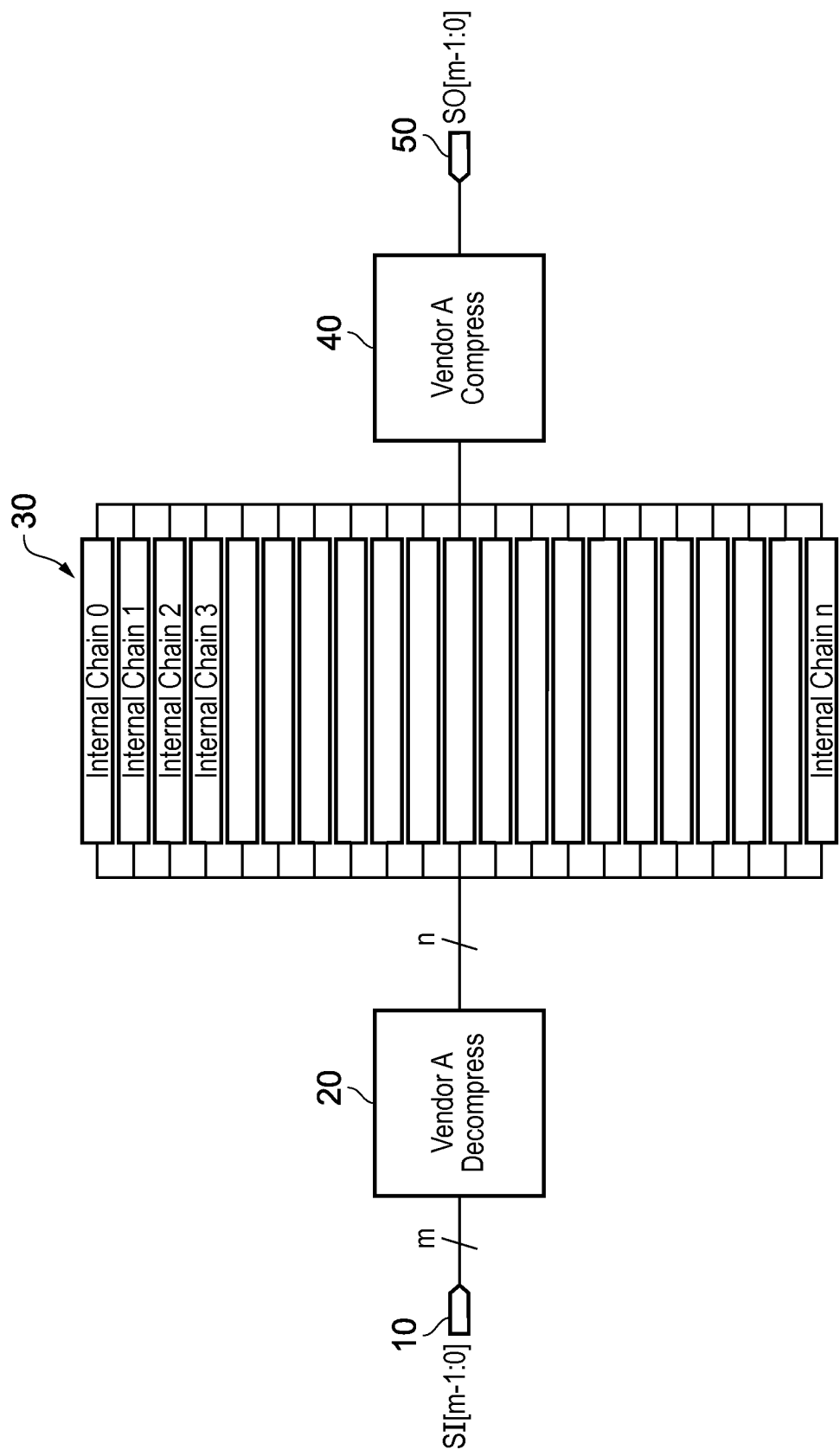
FIG. 1 is a block diagram illustrating a prior art scheme for decompressing compressed input test data prior to provision to a plurality of scan chains, and for compressing the output test data from those scan chains.

FIG. 2 only illustrates a single scan chain, and has purposely been kept very simple for ease of illustration. Often, a data processing apparatus will include a plurality of different scan chains routed through different parts of the circuit, with some scan chains being longer than others. The process of inserting scan chains into a data processing apparatus is typically performed by an EDA tool when the HDL description of the apparatus is converted into the actual circuit design by the EDA tool. The EDA tool will determine which latches to place into any particular scan chain, and how long any particular scan chain will be, having regard to the test requirements of the data processing apparatus. As discussed earlier, it is hence often the case that there will be more scan chains in a particular apparatus than there are pins on the scan-in and scan-out interfaces used to provide input test data to the apparatus and read output test data from the apparatus. Hence, as discussed earlier with reference to FIG. 1, it is known for a particular EDA vendor's tool to insert that vendor's proprietary decompression and compression circuits into the apparatus during the EDA stage of the design. However, thereafter any subsequent user of the apparatus, for example a chip designer seeking to incorporate that apparatus into a chip, is constrained to use for the entire chip the EDA vendor's particular decompression and compression scheme in association with any test data used.

Figure 4:
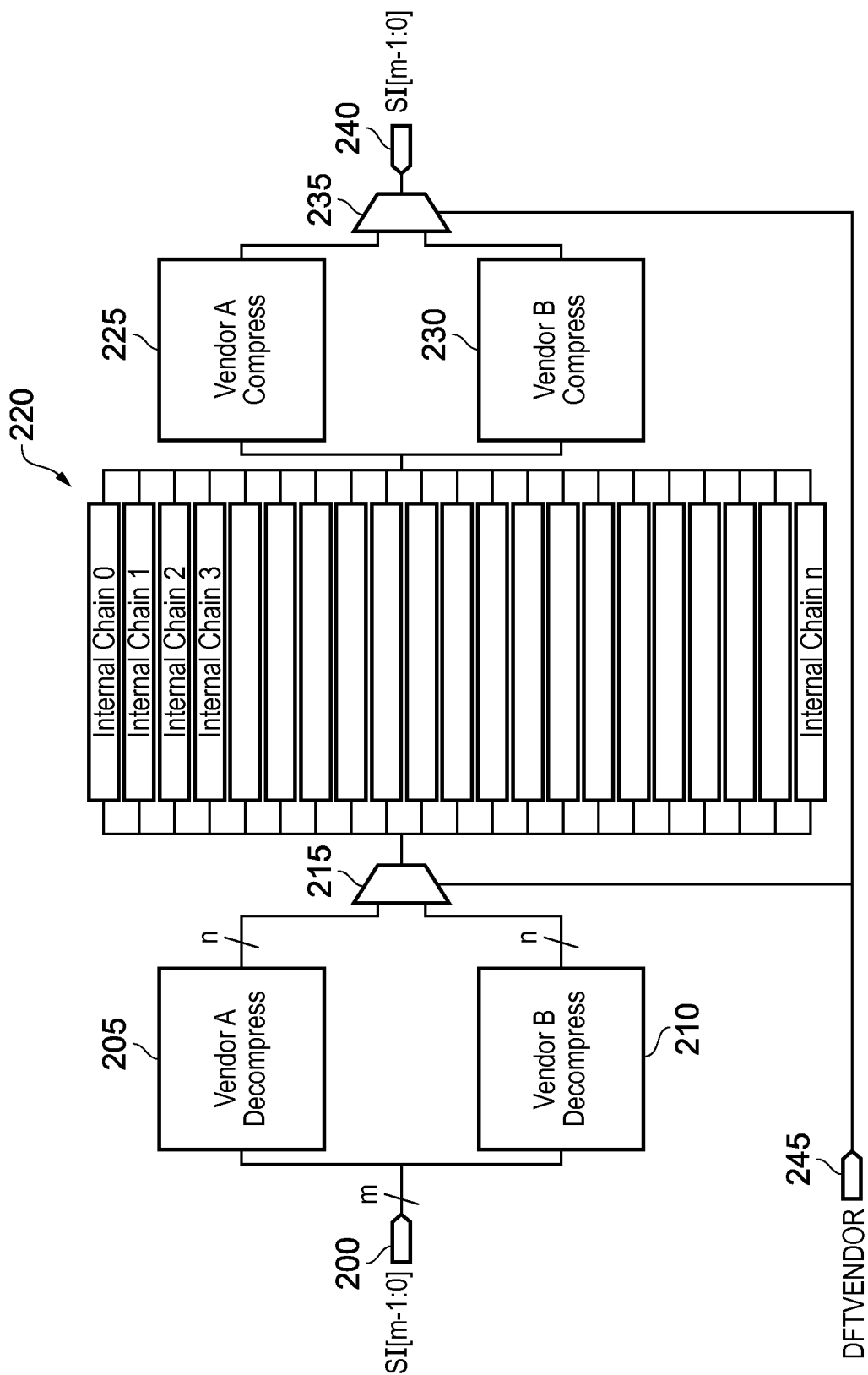
FIG. 4 illustrates a data processing apparatus in accordance with a first embodiment.

FIG. 4 schematically illustrates an embodiment of the present invention which serves to alleviate this constraint. As shown in FIG. 4, a plurality of decompression blocks 205, 210 are inserted during the design process between the scan-in interface 200 and the plurality of scan chains 220. Each decompression block will have an associated decompression scheme, and accordingly by such a process the decompression schemes associated with a plurality of EDA vendors can be supported by the inclusion of appropriate decompression blocks.

Similarly, between the scan chains 220 and the scan-out interface 240, a plurality of compression blocks 225, 230 are provided, each compression block having an associated compression scheme. Often the term "scan interface" is used to refer to both the scan-in interface and the scan-out interface, along with any associated control inputs such as the scan enable input, an input via which the design is placed into a test mode, etc.

Configuration circuitry in the form of the multiplexers 215, 235 is also provided in order to enable one of the decompression blocks 205, 210 and one of the compression blocks 225, 230 to be selected in dependence on a configuration stimulus. In the embodiment illustrated in FIG. 4, the configuration stimulus is provided as a DFTvendor signal received at a configuration pin 245. In one embodiment, it is expected that the value of the DTFvendor input will be tied to a particular value when the apparatus of FIG. 4 is used, and hence for example could be tied by a system integrator to a particular value at the time the apparatus is incorporated into a larger system. This would allow the system integrator to select its preferred EDA tool decompression and compression scheme. Once the pin has been tied, the apparatus (also often referred to herein as the macrocell) will behave in exactly the same way as an equivalent macrocell that had been implemented solely with the single EDA tool preferred by the system integrator. The macrocell can be integrated into multiple chips, with each chip implementer having freedom to select their own preferred test compression and decompression schemes by appropriate setting of the DFTvendor signal.

Figure 8:
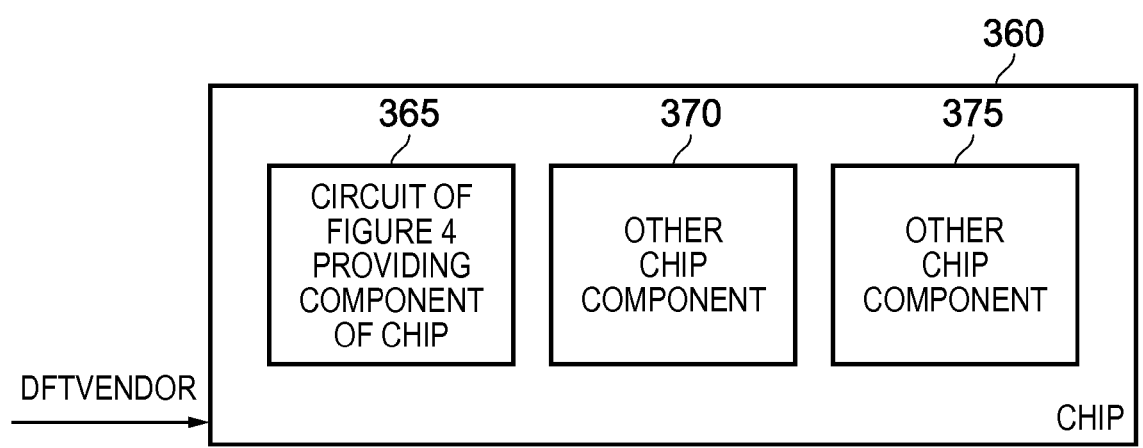
FIG. 8 schematically illustrates a chip incorporating the circuitry of FIG. 4 in accordance with one embodiment.

This is illustrated schematically in FIG. 8, where a chip 360 is considered to include a circuit 365 implemented by the circuit of FIG. 4 (providing one component of a chip), along with a number of other chip components 370, 375. In a typical prior art system, it would be necessary for the chip integrator to use for the entire chip whatever scan compression scheme had been inserted by the EDA tool vendor producing the circuitry 365. However, when the circuitry 365 takes the form of FIG. 4, it is then possible for the chip integrator to select his desired scan compression scheme using the DFTvendor signal, providing significantly improved flexibility.

Whilst it is expected in one embodiment that the DFTvendor signal will be tied to a particular value at the time the apparatus is incorporated into a real system, in an alternative embodiment it is possible for the DFTvendor signal to be changed periodically to allow the decompression scheme and associated compression scheme to be altered, for example so as to allow different forms of compressed input test data to be provided to the apparatus during the test mode of operation.

FIG. 5A illustrates an alternative embodiment, where instead of using the configuration interface 245, the configuration stimulus is actually derived from the data provided over the scan-in interface 200. Hence, in such an embodiment, the particular form of the compressed input test data can be used to determine the actual decompression scheme and associated compression scheme to be used, with the configuration circuitry 215, 235 selecting the appropriate decompression and compression blocks accordingly. In particular, one or more bits of the input test data received via the scan-in interface 200 is routed over path 260 to provide an input to the multiplexers 215, 235.

There are a number of ways in which the compressed input test data may be used to derive the configuration stimulus to be input to the multiplexers 215, 235. However, as shown in FIG. 5B, in one embodiment the compressed input test data 280 may be accompanied by an associated header portion 270 identifying the appropriate decompression and compression blocks to select. In the example of FIG. 5A where two decompression blocks, and two associated compression blocks, are provided, it will be appreciated that the header 270 may comprise a single bit identifying the required decompression and compression blocks to select.

Figure 5:
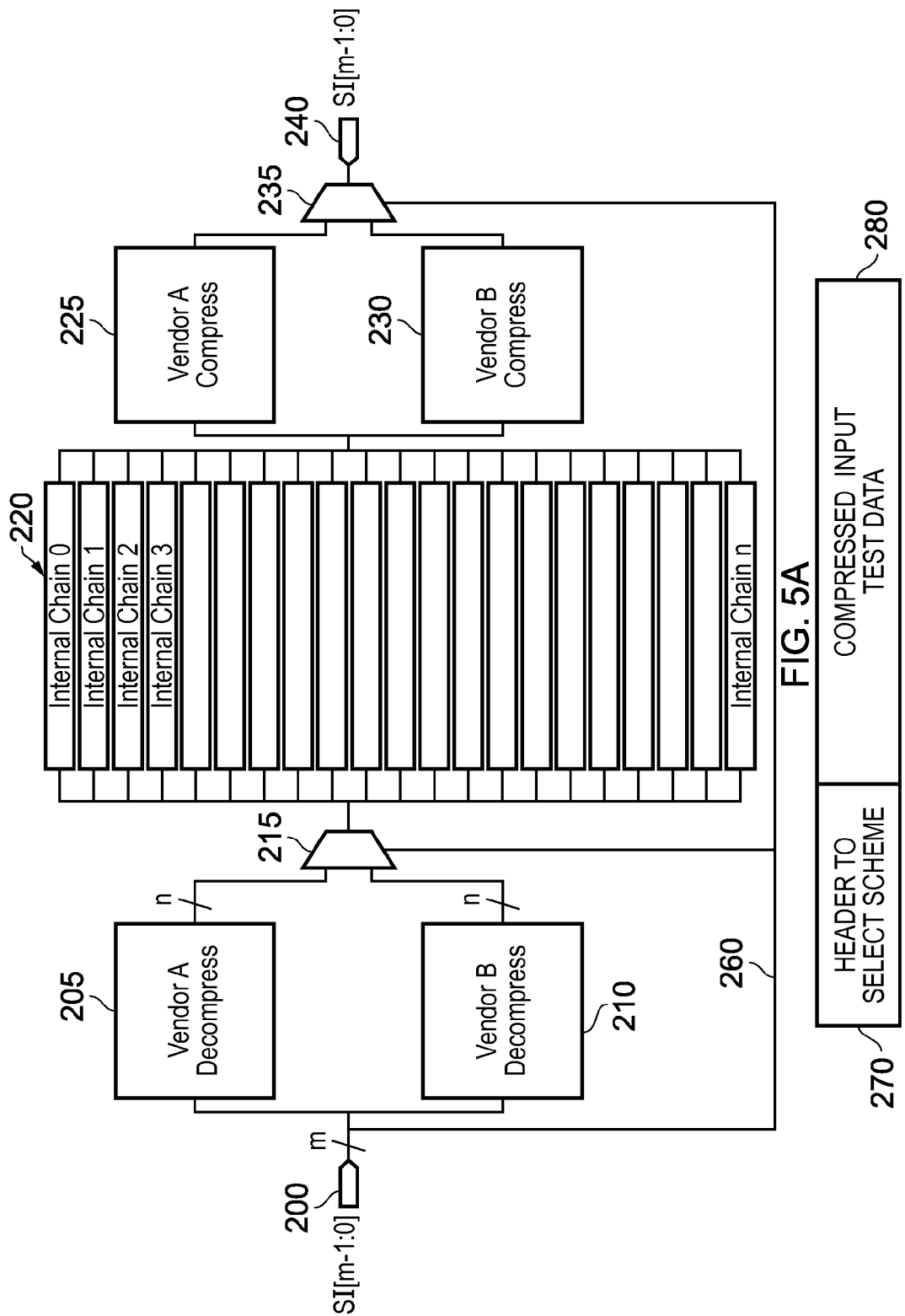
FIG. 5A illustrates a data processing apparatus in accordance with a second embodiment.
FIG. 5B illustrates the form of compressed input test data used in the embodiment of FIG. 5A.
Figure 6:
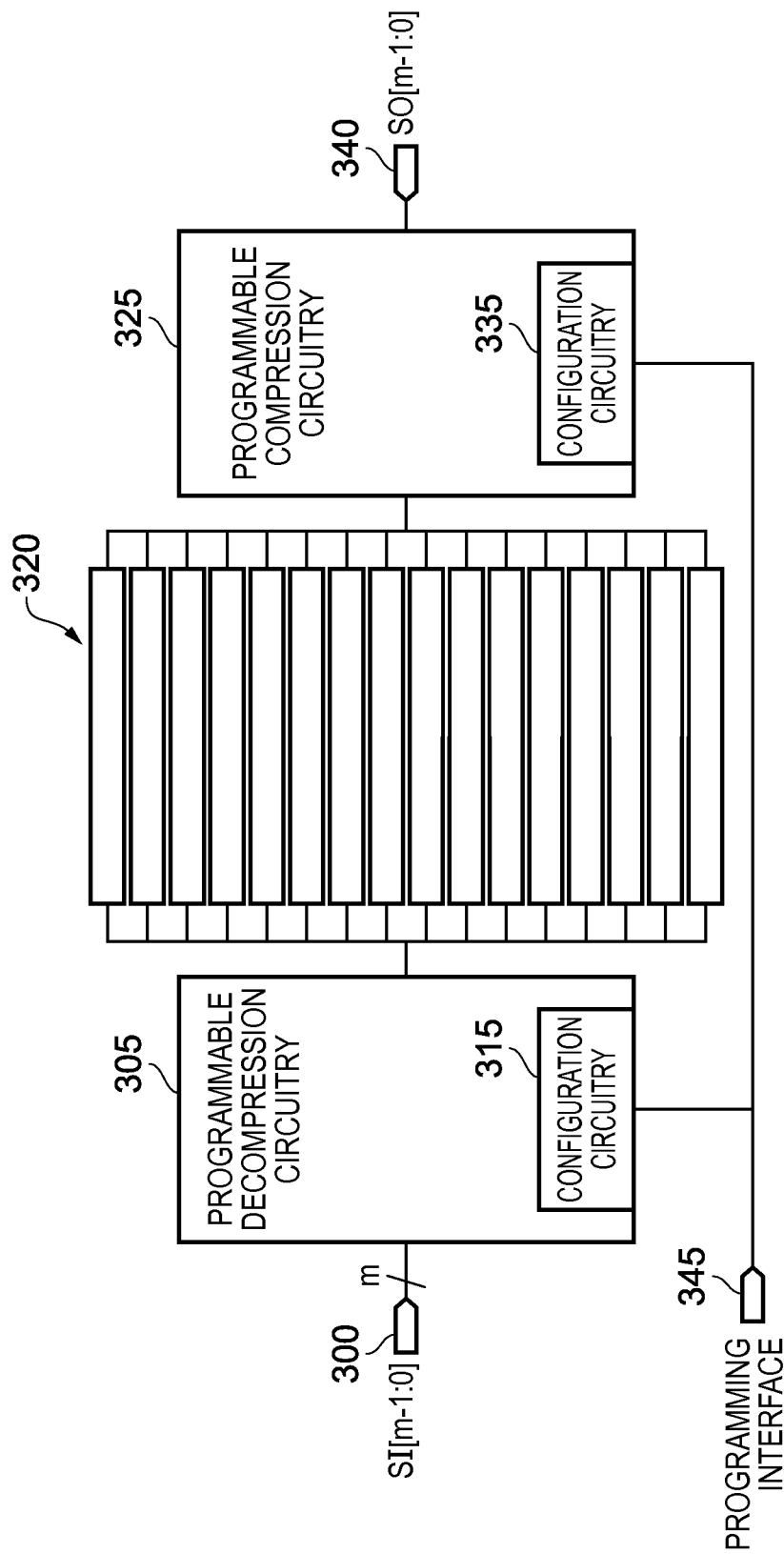
FIG. 6 illustrates a data processing apparatus in accordance with an alternative embodiment.

Whilst in FIGS. 4 and 5, the configurable decompression circuitry and configurable compression circuitry provide a plurality of discrete decompression and compression blocks, in alternative embodiments the configurable decompression circuitry and configurable compression circuitry can take other forms. For example, as shown in FIG. 6, the configurable decompression circuitry can take the form of programmable decompression circuitry 305, and similarly the configurable compression circuitry can take the form of programmable compression circuitry 325. Associated configuration circuitry 315, 335 will then be provided which is responsive to the configuration stimulus provided via a programming interface 345 to program the decompression circuitry 305 and compression circuitry 325 to implement the required decompression and compression schemes. Thereafter, compressed input test data can be routed via the scan-in port 300 through the programmable decompression circuitry 305, where the desired decompression scheme is applied in order to generate the input test data routed through the scan chains 320. Thereafter, the output test data from the scan chains will be routed through the programmable compression circuitry 325, where the required compression scheme is applied in order to produce compressed output test data for routing to the scan-out interface 340.

The programmable decompression circuitry 305 and programmable compression circuitry 325 can take a variety of forms. For example, in one embodiment, these components may be formed as field programmable gate arrays (FPGAs), with software being routed via the programming interface 345 to the configuration circuits 315, 335 to program the FPGAs as required in order to implement the required decompression and compression schemes. Alternatively, the programmable decompression circuitry 305 and programmable compression circuitry 325 may be formed of configurable data path elements with the programming interface 345 being used to route appropriate configuration data to the configuration circuits 315, 335, in order to enable configuration of the data paths to perform the required decompression and compression schemes.

Figure 7:
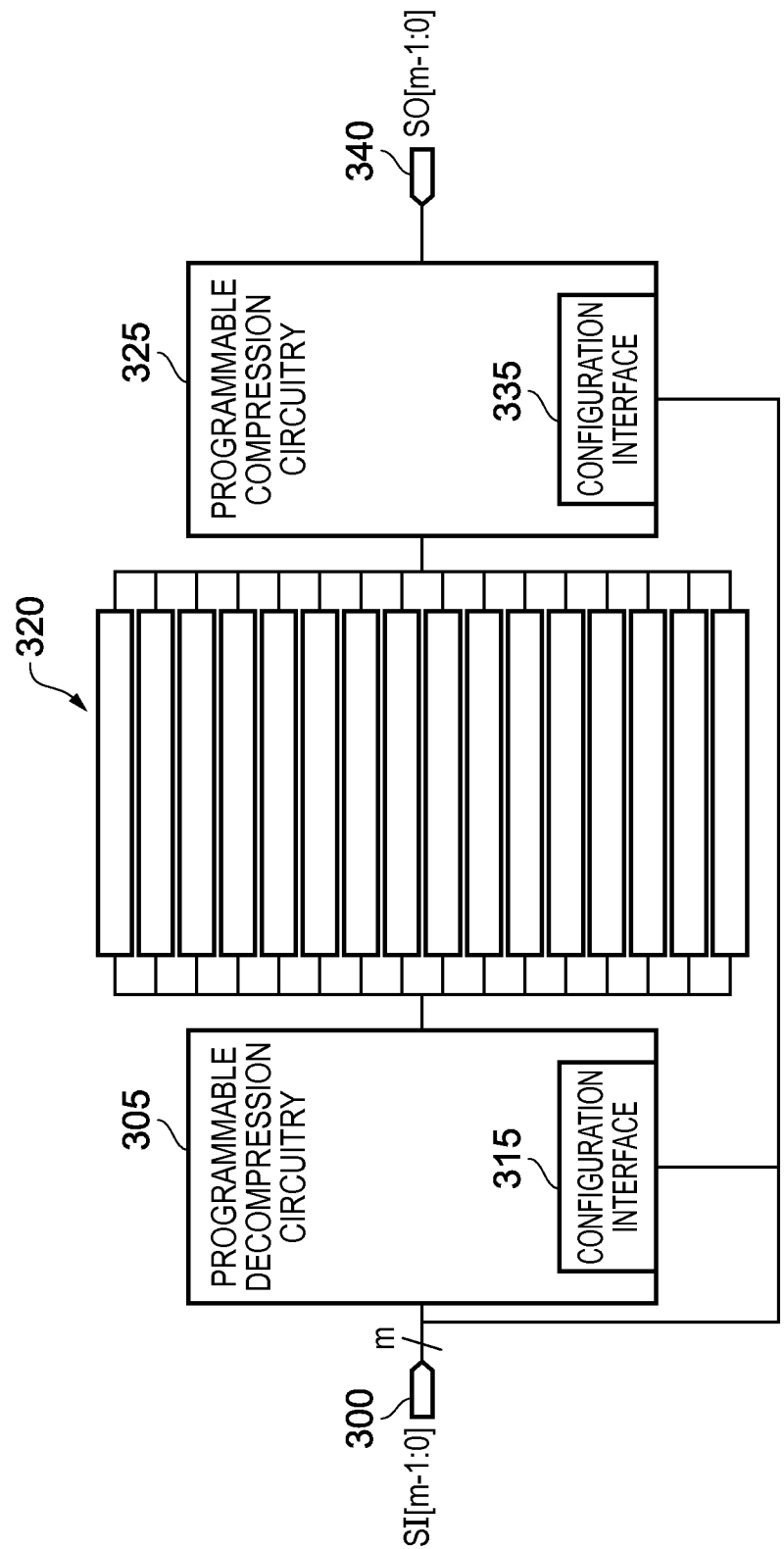
FIG. 7 illustrates a data processing apparatus in accordance with a yet further embodiment.

FIG. 7 illustrates an alternative embodiment where instead of having the separate programming interface 345, the required programming data for the configuration interfaces 315, 335 is obtained from data input directly through the scan-in interface 300. Accordingly, in such embodiments, the required software or configuration data can be input directly through the scan-in interface 300 and routed to the configuration interfaces 315, 335 in order to set up the decompression circuitry 305 and associated compression circuitry 325 before compressed input test data is subsequently input to the scan-in interface 300.

In such embodiments, control logic (not shown) will typically be provided to enable the software/configuration data received at the scan-in interface 300 to be distinguished from actual compressed input test data. There are a number of ways this could be done. In one embodiment, a setup test mode of operation may be provided in addition to the normal test mode of operation, in the setup test mode the control logic routing the data received at the scan-in interface to the configuration interfaces 315, 335 in order to set up the decompression circuitry 305 and associated compression circuitry 325, whereafter the normal test mode is then entered. In an alternative embodiment, the EDA automatic test pattern generation (ATPG) tool is made aware that it needs to program the decompression and compression circuitry, and during the first n cycles the data received at the interface 300 would then contain a header/preamble that contains configuration data instead of test data.

Figure 9:
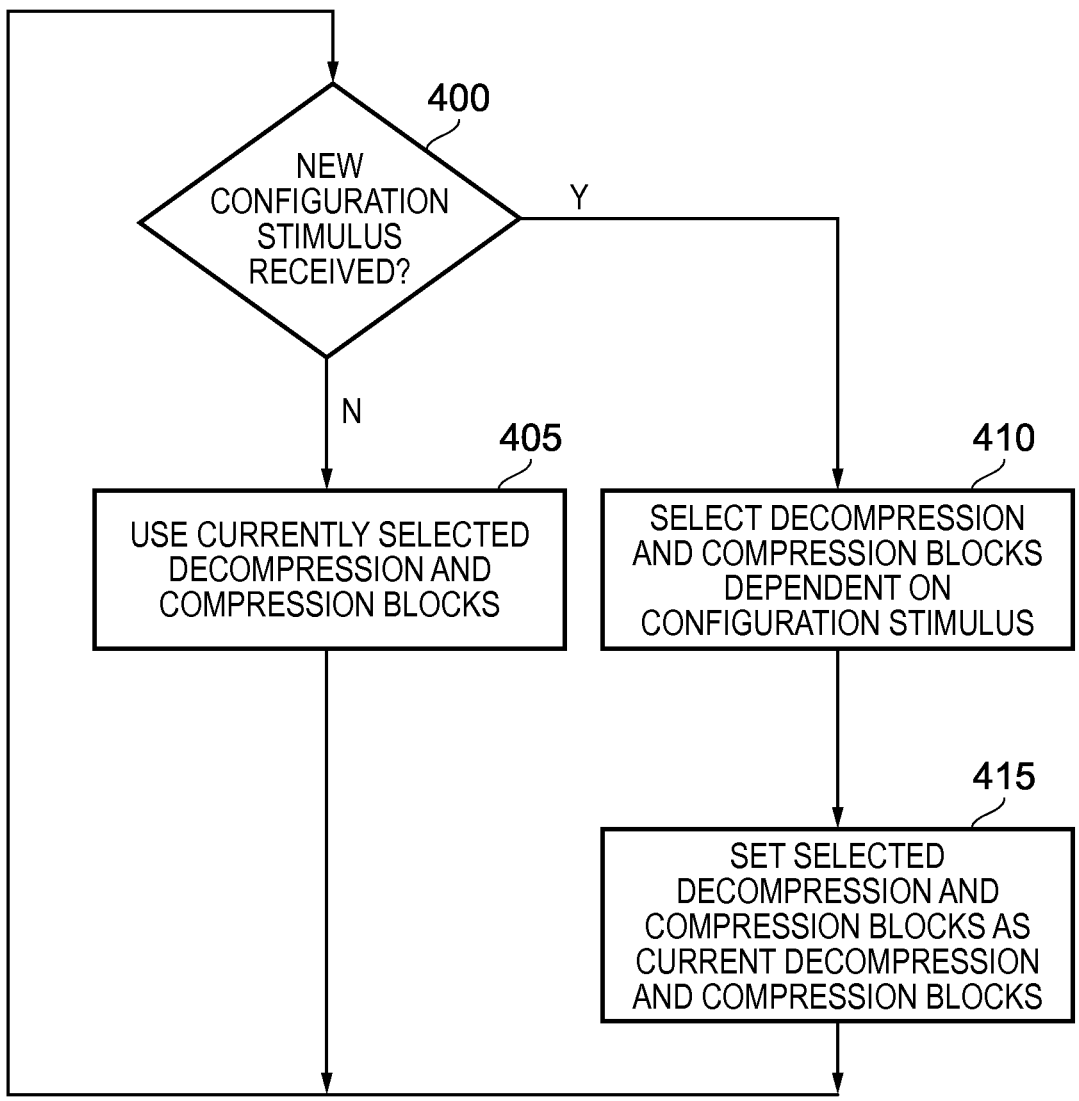
FIG. 9 is a flow diagram illustrating how configuration stimulus may be used to change the decompression and compression schemes in accordance with one embodiment.

As mentioned earlier, in one embodiment the configurable decompression circuitry and configurable compression circuitry may be configured once at the time the circuit is incorporated into a real system in order to identify the decompression scheme and associated compression scheme to be used thereafter. However, in an alternative embodiment, the decompression circuitry and compression circuitry may be reconfigured as desired during use in response to further configuration stimuli. This process is illustrated schematically in FIG. 9, which assumes the embodiments of either FIG. 4 or 5A are being used, where the decompression circuitry and compression circuitry provide a plurality of discrete decompression and compression blocks.

At step 400, it is determined whether a new configuration stimulus has been received, and if not the process proceeds to step 405, where the currently selected decompression and compression blocks are used for any subsequently received compressed input test data.

However, if a new configuration stimulus is received at step 400, the process branches to step 410, where the required compression and decompression blocks are selected dependent on the configuration stimulus. Thereafter, at step 415, the newly selected decompression and compression blocks are set to be the current decompression and compression blocks, whereafter the process returns to step 400.

The above embodiments provide significantly improved flexibility in the use of decompression and compression schemes in association with the scan chains of a data processing apparatus. In particular, such an approach provides a more vendor neutral solution, since it enables such decompression and compression schemes to no longer be tied to the EDA tool that inserted the scan chains.

Whilst in the above embodiments, it is assumed that the data processing apparatus includes both decompression circuitry and compression circuitry, it will be appreciated that in alternative embodiments only one of the decompression circuitry and compression circuitry may be provided, for example if the output test data is output uncompressed (no need for compression circuitry) or if the input test data is input uncompressed (no need for decompression circuitry).

Although a particular embodiment has been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

I claim:

1. A data processing apparatus comprising:
   a circuit block to be tested;
   a plurality of scan chains, each scan chain in said plurality providing a mechanism for providing input test data to, and receiving output test data from, at least a portion of the circuit block during a test mode of operation;
   an input interface for receiving compressed input test data;
   decompression circuitry configured to support a plurality of decompression schemes associated with more than one test generation tool, the decompression circuitry being connected between the input interface and the plurality of scan chains; and
   configuration circuitry, responsive to a configuration stimulus, to configure the decompression circuitry to implement a selected decompression scheme from said plurality, wherein, on receipt of the compressed input test data from the input interface, the decompression circuitry applies the selected decompression scheme to the compressed input test data to produce the input test data to be provided to said plurality of scan chains.

2. The data processing apparatus as claimed in claim 1, further comprising:
   an output interface for outputting compressed output test data; and
   compression circuitry configured to support a plurality of compression schemes associated with more than one test generation tool, the compression circuitry connected between the plurality of scan chains and the output interface;
   the configuration circuitry further responsive to said configuration stimulus, to configure the compression circuitry to implement a selected compression scheme from said plurality, such that on receipt of the output test data from said plurality of scan chains, the compression circuitry applies the selected compression scheme to the output test data to produce said compressed output test data to be provided to said output interface.

3. The data processing apparatus as claimed in claim 1, wherein:
   said decompression circuitry comprises a plurality of decompression blocks, each decompression block configured to implement one of the decompression schemes from said plurality of decompression schemes;
   said configuration circuitry, responsive to the configuration stimulus, to select one of the decompression blocks, such that the decompression scheme associated with the selected decompression block is used to produce, from the compressed input test data, said input test data to be provided to said plurality of scan chains.

4. The data processing apparatus as claimed in claim 1, wherein:
   said decompression circuitry is programmable, and said configuration stimulus provides programming data used by the configuration circuitry to configure the decompression circuitry to implement the selected decompression scheme.

5. The data processing apparatus as claimed in claim 2, wherein:
   said compression circuitry comprises a plurality of compression blocks, each compression block configured to implement one of the compression schemes from said plurality of compression schemes;
   said configuration circuitry, responsive to the configuration stimulus, to select one of the compression blocks, wherein the compression scheme implemented by the selected compression block is used to produce the compressed output test data from the output test data received by said plurality of scan chains.

6. The data processing apparatus as claimed in claim 2, wherein:
   said compression circuitry is programmable, and said configuration stimulus provides programming data used by the configuration circuitry to configure the compression circuitry to implement the selected compression scheme.

7. The data processing apparatus as claimed in claim 1, further comprising:
   a configuration interface configured to receive said configuration stimulus.

8. The data processing apparatus as claimed in claim 1, wherein said configuration stimulus is provided over the input interface that receives the compressed input test data.

9. The data processing apparatus as claimed in claim 8, wherein said configuration stimulus is provided within a header field accompanying the compressed input test data.

10. The data processing circuit as claimed in claim 1, wherein said plurality of scan chains comprises n scan chains, and said input interface comprises m input pins for receiving said compressed input test data, where n is greater than m.

11. The data processing circuit as claimed in claim 10, wherein said output interface comprises p output pins for outputting said compressed output test data, where n is greater than p.

12. The data processing apparatus as claimed in claim 11, wherein m equals p.

13. The data processing apparatus as claimed in claim 1, wherein the circuit block comprises processing circuitry for performing data processing operations.

14. The data processing apparatus as claimed in claim 1, wherein the circuit block comprises a memory circuit for storing data values.

15. An integrated circuit comprising:
    a plurality of circuit blocks, at least one of said circuit blocks being a data processing circuit as claimed in claim 1; and
    an interface for receiving said configuration stimulus;
    whereby the decompression scheme employed in respect of said at least one of said circuit blocks is selectable having regard to the integrated circuit in which the at least one of said circuit blocks is incorporated.

16. The integrated circuit as claimed in claim 15, wherein said integrated circuit is a System-on-Chip (SoC).

17. A data processing apparatus comprising:
    a circuit block to be tested;
    a plurality of scan chains, each scan chain providing a mechanism for providing input test data to, and receiving output test data from, at least a portion of the circuit block during a test mode of operation;
    an output interface for outputting compressed output test data;
    compression circuitry configured to support a plurality of compression schemes associated with more than one test generation tool, the compression circuitry is connected between the plurality of scan chains and the output interface; and
    configuration circuitry, responsive to a configuration stimulus, to configure the compression circuitry to implement a selected compression scheme from said plurality of compression schemes, wherein, on receipt of the output test data from said plurality of scan chains, the compression circuitry applies the selected compression scheme to the output test data to produce said compressed output test data for submission to said output interface.

18. A method of testing a circuit block within a data processing apparatus, comprising the steps of:
(a) providing a plurality of scan chains, each scan chain in said plurality providing a mechanism for providing input test data to, and receiving output test data from, at least a portion of the circuit block;
(b) receiving compressed input test data by decompression circuitry;
(c) responsive to a configuration stimulus, configuring said decompression circuitry to implement a selected decompression scheme from a plurality of decompression schemes associated with more than one test generation tool and supported by the decompression circuitry;
(d) on receipt by the decompression circuitry of the compressed input test data received at said step (b), applying the selected decompression scheme to the compressed input test data to produce the input test data; and
(e) providing to said plurality of scan chains the input test data produced at said step (d).

19. The method as claimed in claim 18, further comprising the steps of:
(f) responsive to said configuration stimulus, configuring said compression circuitry to implement a selected compression scheme from a plurality of compression schemes associated with more than one test generation tool and supported by said compression circuitry;
(g) on receipt by the compression circuitry of the output test data from said plurality of scan chains, applying the selected compression scheme to the output test data to produce compressed output test data; and
(h) providing to an output interface the compressed output test data produced at said step (g).

20. The method as claimed in claim 18, wherein:
at said step (b), the compressed input test data received is generated by a test generation tool; and
at said step (c), the configuration stimulus is chosen so as to configure the decompression circuitry to implement said selected decompression scheme having regard to at least one test generation algorithm employed by the test generation tool.

21. A data processing apparatus comprising:
circuit under test;
a plurality of scan chain means, each scan chain means comprising a means for providing a mechanism for providing input test data to, and receiving output test data from, at least a portion of the circuit under test during a test mode of operation;
input interface means for receiving compressed input test data;
configurable decompression means for supporting a plurality of decompression schemes associated with more than one test generation tool, the configurable decompression means being connected between the input interface means and the plurality of scan chain means; and
configuration means, responsive to a configuration stimulus, for configuring the configurable decompression means to implement a selected decompression scheme from said plurality, such that on receipt of the compressed input test data from the input interface means the configurable decompression means applies the selected decompression scheme to the compressed input test data to produce the input test data to be provided to said plurality of scan chain means.

* * * * *